United States Patent
Pan et al.

(10) Patent No.: US 12,494,765 B2
(45) Date of Patent: Dec. 9, 2025

(54) INTEGRATED DEVICE BASED ON THIRD-GENERATION SEMICONDUCTOR AND MANUFACTURING METHOD THEREOF

(71) Applicant: SUZHOU DABO NEW MATERIAL TECHNOLOGY CO., LTD., Suzhou (CN)

(72) Inventors: Feng Pan, Suzhou (CN); Rongxuan Su, Suzhou (CN); Rui Wang, Suzhou (CN); Mengxuan Qian, Suzhou (CN)

(73) Assignee: SUZHOU DABO NEW MATERIAL TECHNOLOGY CO. LTD., Suzhou (CN)

( * ) Notice: Subject to any disclaimer, the term of this patent is extended or adjusted under 35 U.S.C. 154(b) by 0 days.

(21) Appl. No.: 18/994,084

(22) PCT Filed: Aug. 21, 2024

(86) PCT No.: PCT/CN2024/113634
§ 371 (c)(1),
(2) Date: Jan. 14, 2025

(87) PCT Pub. No.: WO2025/138926
PCT Pub. Date: Jul. 3, 2025

(65) Prior Publication Data
US 2025/0266803 A1 Aug. 21, 2025

(30) Foreign Application Priority Data
Dec. 28, 2023 (CN) .......... 202311835589.2

(51) Int. Cl.
*H03H 9/145* (2006.01)
*H03H 3/08* (2006.01)
(Continued)

(52) U.S. Cl.
CPC .......... *H03H 9/02574* (2013.01); *H03H 3/08* (2013.01); *H03H 9/02566* (2013.01);
(Continued)

(58) Field of Classification Search
CPC .......... H03H 9/02574; H03H 9/02566; H03H 9/6489; H03H 3/08; H10N 30/076;
(Continued)

(56) References Cited

U.S. PATENT DOCUMENTS

2006/0065929 A1    3/2006   Lee et al.

FOREIGN PATENT DOCUMENTS

CN    1757161 A    4/2006
CN    104917483 A    9/2015
(Continued)

OTHER PUBLICATIONS

Tsutomu Takai, et al., High-Performance SAW Resonator on New Multilayered Substrate Using LiTaO3 Crystal, IEEE Transactions on Ultrasonics, Ferroelectrics, and Frequency Control, 2017, pp. 1382-1389, vol. 64 No.9.

*Primary Examiner* — Emily P Pham
*Assistant Examiner* — Monica Mata
(74) *Attorney, Agent, or Firm* — Bayramoglu Law Offices LLC

(57) ABSTRACT

An integrated device based on a third-generation semiconductor and a manufacturing method thereof are provided. The integrated device at least includes a SiC substrate, a buffer layer, a GaN film layer and a piezoelectric material layer; the SiC substrate includes a first buffer layer stacked on a first SiC substrate and a second buffer layer stacked on a second SiC substrate; the GaN film layer at least includes a first GaN film layer stacked on the first buffer layer and a second GaN film layer stacked on the second buffer layer; the first SiC substrate, the first buffer layer, the first GaN film
(Continued)

layer and the piezoelectric material layer which are stacked are used for forming a piezoelectric multi-layer film; the piezoelectric multi-layer film is used for forming a surface acoustic wave (SAW) filter.

16 Claims, 4 Drawing Sheets

(51) Int. Cl.
  *H03H 9/02* (2006.01)
  *H03H 9/64* (2006.01)
  *H10N 30/076* (2023.01)
  *H10N 30/081* (2023.01)
  *H10N 30/082* (2023.01)
  *H10N 30/853* (2023.01)
  *H10N 39/00* (2023.01)
(52) U.S. Cl.
  CPC ........ *H03H 9/6489* (2013.01); *H10N 30/076* (2023.02); *H10N 30/081* (2023.02); *H10N 30/082* (2023.02); *H10N 30/8542* (2023.02); *H10N 30/8548* (2023.02); *H10N 30/8561* (2023.02); *H10N 39/00* (2023.02)
(58) Field of Classification Search
  CPC .............. H10N 30/081; H10N 30/082; H10N 30/8542; H10N 30/8548; H10N 30/8561; H10N 39/00
  USPC ...................................... 310/313 R
  See application file for complete search history.

(56) References Cited

FOREIGN PATENT DOCUMENTS

| | | |
|---|---|---|
| CN | 106416067 A | 2/2017 |
| CN | 111682860 A | 9/2020 |
| CN | 215072339 U | 12/2021 |
| CN | 114553162 A | 5/2022 |
| CN | 117013984 A | 11/2023 |
| CN | 117580438 A | 2/2024 |

INTEGRATED DEVICE BASED ON THIRD-GENERATION SEMICONDUCTOR AND MANUFACTURING METHOD THEREOF

CROSS-REFERENCE TO THE RELATED APPLICATIONS

This application is the national phase entry of International Application No. PCT/CN2024/113634, filed on Aug. 21, 2024, which is based upon and claims priority to Chinese Patent Application No. 202311835589.2, filed on Dec. 28, 2023, the entire contents of which are incorporated herein by reference.

TECHNICAL FIELD

The present disclosure relates to the technical field of electronic information materials, and particularly to an integrated device based on a third-generation semiconductor and a manufacturing method thereof.

BACKGROUND

A surface acoustic wave (SAW) filter is the preferred filtering technical solution for current radio frequency due to its advantages of small size, low price and simple process, etc. However, 5G communication proposes performance requirements such as high frequency, large bandwidth, high power and low loss to filters, which has far exceeded the limit that the SAW technology can achieve. Its main bottleneck is that insufficient electromechanical coupling coefficient and quality factor of a commercial piezoelectric material (lithium tantalate and lithium niobate) cannot support communication requirements of large bandwidth and low loss; in addition, the increased heat of input power is gathered on a chip so that a device is burnt. How to design a new piezoelectric material to enable the SAW technology to be expanded to 5-generation (5G) is a key technical difficulty in the field of radio frequency.

In order to solve the above problem, Japanese researchers Takai et al. proposed for the first time the formation of a piezoelectric multi-layer film (LiTaO$_3$/SiO$_2$/AlN/Si) by bonding a hundred nanometer piezoelectric film onto a silicon substrate with higher sound velocity, so that sound waves can be more confined to the surface of the substrate, thereby greatly improving the electromechanical coupling ability and quality factor of the device, and enhancing the cooling ability of the device at high input power by utilizing the thermal conductivity of silicon. However, the silicon substrate is still a conventional semiconductor substrate material, and its limitations in sound velocity and thermal conductivity still cannot meet the performance requirements of 5G communication on devices. For example, Chinese invention patent CN111682860A discloses an integrated device manufacturing method and related products, in which lattice mismatch is caused by reducing heteroepitaxy of SiC and GaN through a buffer layer, however, when wafer bonding is performed for filters, power amplifiers and initial wafers, but the patent mainly uses bulk acoustic wave (BAW) filters, so a backside process needs to be completed to obtain a complete integrated device.

Therefore, to achieve the application of the SAW technology in 5G, it is urgent to develop a piezoelectric multi-layer film with high electromechanical coupling and boost integrated development of filters and other radio frequency devices.

SUMMARY

In view of this, in order to solve the above problem, the present disclosure provides an integrated device based on a third-generation semiconductor and a manufacturing method thereof. By the present disclosure, SAW filters and radio frequency devices are integrated into one device, and the introduction of a GAN film layer can also play a role in optimizing the performances of the devices.

In order to achieve the above objective, the present disclosure provides an integrated device based on a third-generation semiconductor, the integrated device at least comprises:

a SiC substrate comprising a first SiC substrate and a second SiC substrate which are arranged in a specified direction;
a buffer layer comprising a first buffer layer stacked on the first SiC substrate and a second buffer layer stacked on the second SiC substrate;
a GaN film layer comprising a first GaN film layer stacked on the first buffer layer and a second GaN film layer stacked on the second buffer layer; the first GaN film layer being arranged on the first buffer layer, and the second GaN film layer being arranged on the second buffer layer;
a piezoelectric material layer stacked on the first GaN film layer;
wherein the first SiC substrate, the first buffer layer, the first GaN film layer and the piezoelectric material layer which are stacked are used for forming a piezoelectric multi-layer film, and the piezoelectric multi-layer film is used for forming an SAW filter.

Preferably, the piezoelectric material layer directly grows on the surface of the first GaN film layer, or the piezoelectric material layer is bonded onto the surface of the first GaN film layer.

Preferably, the thickness of the GaN film layer is 50-5000 nm.

Preferably, the thickness of the GaN film layer is 200-400 nm.

More preferably, the thickness of the GaN film layer is 400 nm.

Preferably, the integrated device further comprises a functional layer. The functional layer is stacked on the first GaN film layer; the piezoelectric material layer is stacked on the functional layer; the piezoelectric multi-layer film comprises the first SiC substrate, the first buffer layer, the first GaN film layer, the functional layer and the piezoelectric material layer which are stacked.

Preferably, the piezoelectric material layer directly grows on the surface of the functional layer, or the piezoelectric material layer is bonded onto the surface of the functional layer.

Preferably, the material of the functional layer comprises a combination of any one or more of SiO$_2$, Si$_3$N$_4$ and TeO$_2$.

Preferably, the thickness of the functional layer is 50-3000 nm.

Preferably, the second SiC substrate, the second buffer layer, the second GaN film layer which are stacked are used for forming a radio frequency device; the thickness of the SiC substrate is 50-500 μm.

Preferably, the radio frequency device is a power amplifier.

Preferably, the SiC substrate is a wafer-level substrate.
Preferably, the thickness of the buffer layer is 50-2000 nm.
Preferably, the material of the buffer layer comprises AlN.

Preferably, the material of the piezoelectric material layer comprises a combination of any one or more of lithium niobate, lithium tantalate, quartz, gallium lanthanum silicate, potassium niobate, lead magnesium niobate lead titanate, bismuth germanate and zinc oxide single crystal.

Preferably, the thickness of the piezoelectric material layer is 50-3000 nm.

In a preferred embodiment, the piezoelectric single crystal film directly grows on the surface of the GaN film layer, or the piezoelectric single crystal film is bonded onto the surface of the GaN film layer.

Preferably, the thickness of the SiC substrate is 50-500 µm.

Further, the SiC substrate is a wafer-level substrate, and comprises c-plane, a-plane or r-plane cut shapes.

Compared with the existing SAW filters, the technical solution provided in the present disclosure fully exerts the advantages of the third-generation semiconductors, the high sound velocity of SiC will significantly increase the usage frequency of SAW, and SAW is limited to the surface of the piezoelectric single crystal film through a waveguide effect, thereby improving the electromechanical coupling coefficient and quality factor of the SAW filter.

In order to achieve another objective, the present disclosure further provides a manufacturing method of the integrated device mentioned above, specifically comprising the following steps:

the integrated device comprises an integrated device SAW filter. The SAW filter comprises a piezoelectric multi-layer film. The manufacturing method comprises the following steps:

providing a SiC substrate, wherein the SiC substrate comprises a first SiC substrate and a second SiC substrate which are arranged in a specified direction;

growing a GaN film layer on the first SiC substrate and the second SiC substrate, wherein the GaN film layer at least comprises a first GaN film layer stacked on the first SiC substrate and a second GaN film layer stacked on the second SiC substrate;

growing a piezoelectric material layer on the first GaN film layer;

wherein the piezoelectric multi-layer film comprises the first SiC substrate, the first GaN film layer and the piezoelectric material layer which are stacked.

As a preferred embodiment, the manufacturing method of the integrated device mentioned above further comprises: directly growing the piezoelectric multi-layer film on the first GaN film layer.

As a preferred embodiment, a piezoelectric single crystal film with a damaged layer formed inside is bonded to the GaN film layer, and the piezoelectric single crystal film is dissociated along the damaged layer to obtain the piezoelectric material layer bonded onto the GaN film layer.

As a preferred embodiment, a part of the piezoelectric material layer stacked on the second region of the surface of the GaN film layer is removed, so that the second region of the surface of the GaN film layer is exposed, and a part of the piezoelectric material layer stacked on the first region of the surface of the GaN film layer is remained.

Preferably, the buffer layer, the GaN film layer and the functional layer successively grow on the SiC substrate.

Preferably, the piezoelectric material layer grows on the functional layer.

Preferably, the damaged layer is formed in the piezoelectric single crystal film through an ion implantation process under the first set condition, wherein ions used for the ion implantation process comprise hydrogen ions and/or helium ions, the ion implantation energy is 1-2000 keV, and the implantation dose is $1 \times 10^{16}$-$1.5 \times 10^{17}$ $cm^{-2}$; the first set condition comprises a temperature of 20-150° C., a vacuum degree of less than $10^{-4}$ Pa and a pressure of 70-1000 N.

Preferably, the piezoelectric single crystal film is dissociated along the damaged layer through an annealing lift-off process under the second set condition, wherein the second set condition comprises an annealing temperature of 300-700° C. and the time of 0.1-5 h.

Preferably, the piezoelectric single crystal film grows by using a magnetron sputtering method under the third set condition, wherein a magnetron sputtering source is a planar target magnetron sputtering source, and the third set condition comprises a power of 10-1000 W, a temperature of 20-700° C., a pressure of 0.5-1.2 Pa and a distance between a target material and a substrate of 60-80 mm.

Preferably, the partial region of the piezoelectric single crystal film is at least etched by using a mask, until the surface of the second GaN film layer is exposed to form an etched second region and an unetched first region; the obtained second region can be used for manufacturing a radio frequency device which is integrated with the SAW filter formed by the unetched first region, with once completion and without a backside process.

Preferably, the etching method comprises dry-process etching and/or wet-process corrosion.

When the integrated device provided by using the above technical solution is applied to the SAW filter, the frequency of the SAW filter can be more than 5.8 GHz and above and the electrochemical coupling coefficient of the SAW filter is 20% and above. Furthermore, the introduction of the GaN film layer can effectively inhibit a parasitic mode, especially when the thickness of the GaN film layer is 200-400 nm, a burr-free admittance response can be obtained. Thus, the integrated device provided by using the above technical solution is suitable for the requirements of 5G large-bandwidth low-loss filtering, and is expected to be applied to frequency bands such as n77 and n78 for 5G communication and/or be applied to sub-6G frequency bands.

The present disclosure has the beneficial effects:
1. Compared with the existing SAW filter, the technical solution provided by the present disclosure fully exerts the advantages of the third-generation semiconductors, the high sound velocity of SiC will significantly increase the usage frequency of SAW, and SAW is limited to the surface of the piezoelectric single crystal film through a waveguide effect, thereby improving the electromechanical coupling coefficient and quality factor of the SAW filter; in addition, the epitaxial growth of the GaN film layer on the SiC substrate facilitates the integration of the SAW filter and the radio frequency device through a plane process under the same wafer, thereby improving the preparation process of the integrated device.
2. The piezoelectric multi-layer film prepared by the technical solution of the present disclosure is simple in structure, and its preparation method can be used in combination with the semiconductor processing process in the prior art, and the material is simple, so that the processing cost is greatly reduced, and the piezoelectric material with high electrochemical coupling coefficient can be obtained, the prepared piezoelectric multi-layer film can be directly applied to a surface acoustic wave device, and is suitable for the requirements of 5G bandwidth filtering.
3. The piezoelectric multi-layer film provided by the present disclosure is adopted, the GaN film layer introduced in this structure can take the effects of regulating and optimizing the properties of the SAW filter, especially has a good inhibition effect in a parasitic mode; compared with the BAW technology, the technical solution of the present disclosure does not need backside manufacturing process, and AlN used in the BAW has higher electrochemical coupling coefficient and is more suitable for 5G large-bandwidth filtering compared with LN used in SAW technology.

4. In the present disclosure, the GaN film layer directly epitaxially grows after the buffer layer grows on the surface of the SiC substrate, in such the way, the number of layers on the material structure is reduced while lowering the thickness of the entire piezoelectric multi-layer film, and therefore the technical solution of the present disclosure is simple.

5. The technical solution of the present disclosure combines the integration technology with the ion implantation-bonding-annealing lift-off process without the backside process, and the piezoelectric single crystal film with less than 300 nm can be obtained by a method for reducing the thickness of the piezoelectric single crystal film through a single side.

Figure 1:
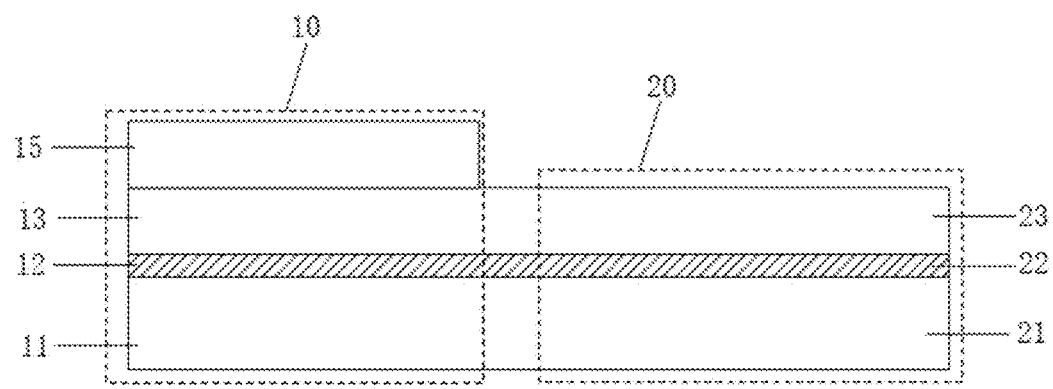
FIG. 1 is a structural diagram of an integrated device based on a third-generation semiconductor in example 1 of the present disclosure.

In the figures, reference numerals are as follows: 10—SAW filter; 11—first SiC substrate; 12—first buffer layer; 13—first GaN film layer; 14—functional layer; 15—piezoelectric material layer; 16—damaged layer; 17—lift-off layer; 20—radio frequency device; 21—second SiC substrate; 22—second buffer layer; 23—second GaN film layer.

DETAILED DESCRIPTION OF THE EMBODIMENTS

To make the purpose, technical solution and advantages of the embodiments of the present disclosure more clear, the technical solution will be clearly and completely described in combination with accompanying drawings in embodiments of the present disclosure, obviously, the described embodiments are some embodiments of the present disclosure but not all the embodiments.

The present disclosure provides an integrated device based on a third-generation semiconductor. The integrated device comprises two functional regions, namely, a first region and a second region, which can be integrated into a device with two different functions.

In some preferred embodiments, the integrated device comprises an SAW filter and a power amplifier.

The integrated device at least comprises a SiC substrate, a buffer layer, a GaN film layer and a piezoelectric material layer.

The SiC substrate comprises a first SiC substrate and a second SiC substrate that are arranged in a specified direction; the first SiC substrate and the second SiC substrate are arranged in parallel in the specified direction, or the entire substrate material with a proper size is selected to be divided into two regions that are used as the first SiC substrate and the second SiC substrate respectively.

Preferably, the thickness of the SiC substrate is 50-500 μm, the SiC substrate can be a wafer-level substrate, i.e., the SiC material in the SiC substrate is a wafer-level material comprising any one of c-plane, a-plane or r-plane or special cut shapes.

The buffer layer comprises a first buffer layer stacked on the first SiC substrate and a second buffer layer stacked on the second SiC substrate; specifically, the thickness of the buffer layer is 50-2000 nm, and the material of the buffer layer comprises AlN.

The GaN film layer comprises a first GaN film layer stacked on the first buffer layer and a second GaN film layer stacked on the second buffer layer; specifically, the GaN film layer has a wafer-level size.

The piezoelectric material layer is stacked on the first GaN film layer.

Specifically, the material of the piezoelectric material comprises a combination of any one or more of lithium niobate, lithium tantalate, quartz, gallium lanthanum silicate, potassium niobate, lead magnesium niobate lead titanate, bismuth germanate and zinc oxide single crystal; the thickness of the piezoelectric material layer is 50-3000 nm; the piezoelectric material layer has a wafer-level size.

Further, the SAW filter comprises a piezoelectric multi-layer film comprising the first SiC substrate, the first buffer layer, the first GaN film layer and the piezoelectric material layer which are stacked, i.e., the piezoelectric multi-layer film has the first SiC substrate, the first buffer layer, the first GaN film layer and the piezoelectric material layer from bottom to top; a region where the SAW filter is located is marked as a first region.

The second SiC substrate, the second buffer layer and the second GaN film layer which are stacked are used for forming a radio frequency device, i.e., the radio frequency device has the second SiC substrate, the second buffer layer and the second GaN film layer from bottom to top; a region where the radio frequency device is located is marked as a second region, and the radio frequency device is a power amplifier.

In some preferred embodiments, the integrated device further comprises a functional layer which is stacked on the first GaN film layer; the piezoelectric material layer is stacked on the functional layer.

Specifically, the material of the functional layer comprises a combination of any one or more of $SiO_2$, $Si_3N_4$ and $TeO_2$; the thickness of the functional layer is 50-3000 nm.

In some preferred embodiments, the piezoelectric material layer directly grows on the surface of the first GaN film layer; or, the piezoelectric material layer directly grows on the surface of the functional layer.

Further, the piezoelectric material layer is a piezoelectric single crystal film which can directly grow on the functional layer or the GaN film layer by using a magnetron sputtering method under the growth conditions including: the magnetron sputtering source is a planar target magnetron sputtering source; the power is 10-1000 W; the temperature is 20-700°

C.; the pressure of the system is 0.5-1.2 Pa; the distance between the target material and the substrate is 60-80 mm.

In some preferred embodiments, the functional layer grows on the GaN film layer and the thickness of the functional layer is 50-2000 nm. The piezoelectric material layer is bonded onto the surface of the functional layer, for example, the piezoelectric material layer is bonded to the functional layer through a first bonding layer.

Alternatively, the piezoelectric material layer is bonded onto the surface of the first GaN film layer, for example, the piezoelectric material layer is bonded to the first GaN film layer through a second bonding layer.

Further, the piezoelectric material layer is a piezoelectric single crystal film. After the piezoelectric single crystal film grows on the functional layer, photoresist is coated onto the piezoelectric material layer; the photoresist is exposed by using a mask and developed; then partial regions (marked as etching regions) of the piezoelectric single crystal film and the functional layer that need etching are etched to expose the GaN film layer, and the remained regions are protected by the photoresist. Specifically, the remained regions are used for manufacturing the SAW filter, and the etching regions are used for manufacturing the radio frequency device, so that the SAW filter and the radio frequency device are integrated onto one device.

Preferably, the etching method comprises dry-process etching or wet-process etching, such as argon ion etching, reaction ion etching (RIE) or inductively coupled plasma (ICP) etching.

It can be understood that the bonding of the piezoelectric material layer includes but is not limited to direct bonding or polymer bonding, or means in the prior art that can achieve bonding is used.

In some preferred embodiments, the piezoelectric multi-layer film is transferred from the piezoelectric single crystal film through the ion implantation-bonding-annealing lift-off process, and the piezoelectric material layer is bonded onto the surface of the functional layer or the GaN film layer. The piezoelectric material layer takes the effect of acoustic-electric conversion, and can excite one or more of Rayleigh waves, leaky longitudinal waves and horizontal shear waves, which is determined by subsequent electron arrangement and material types.

Specifically, ion implantation is performed on the process surface of the piezoelectric single crystal film so that the damaged layer is formed at the set thickness of the piezoelectric crystal single film body; the process surface of the piezoelectric single crystal film is bonded onto the surface of the functional layer or the GaN film layer to form a bonding structure; the bonding structure is subjected to annealing lift-off process treatment so that the piezoelectric single crystal film is dissociated along the damaged layer, so as to obtain the bonding structure that keeps the bonding with the surface of the functional layer or the GaN film layer; and then the dissociated surface of the piezoelectric single crystal film is subjected to flattening treatment to obtain the piezoelectric material layer.

In some preferred embodiments, in the above process (i.e., ion implantation-bonding-annealing lift-off), the damaged layer is formed in the piezoelectric single crystal film through the ion implantation process under the first set condition, the used ions comprise hydrogen ions and/or helium ions, the implantation energy is 1-2000 keV, and the implantation dose is $1 \times 10^{16}$-$1.5 \times 10^{17}$ cm$^{-2}$; preferably, the first set condition comprises a temperature of 20-150° C., a vacuum degree of less than $10^{-4}$ Pa, and a pressure of 70-1000 N.

In some preferred embodiments, the piezoelectric single crystal film is dissociated along the damaged layer through the annealing lift-off process under the second set condition; preferably, the second set condition comprises an annealing temperature of 300-700° C. and the time of 0.1-5 h.

The piezoelectric single crystal film grows by using the magnetron sputtering method under the third set condition, wherein the used magnetron sputtering source is a planar target magnetron sputtering source; preferably, the third set condition comprises a power of 10-1000 W, a temperature of 20-700° C., a pressure of 0.5-1.2 Pa, and a distance between the target material and the substrate of 60-80 mm.

In some preferred embodiments, partial regions of the piezoelectric material layer and the functional layer are etched, until the second GaN film layer is exposed. The two functional regions with different stacked structures and different functions, such as the first functional region and the second functional region, are obtained after etching, so as to achieve the integration of the SAW filter and the radio frequency device into one device, which not only can greatly reduce the size of the device and improve the performance, but also achieves the integration of two radio frequency devices under the same wafer so as to significantly reduce the manufacturing cost of the front-end process.

Next, the technical solution of the present disclosure will be described in detail through specific embodiments.

Example 1

An integrated device manufactured in this example is as shown in FIG. 1. The integrated device comprises two functional regions, i.e., a first region and a second region that have different stacked structures and different functions, wherein the first region is used for manufacturing an SAW filter 10, and the second region is used for manufacturing a radio frequency device 20. Preferably, the radio frequency device in this example is a power amplifier.

The SAW filter 10 successively comprises a first SiC substrate 11, a first buffer layer 12, a first GaN film layer 13 and a piezoelectric material layer 15. The piezoelectric material layer 15 grows by a magnetron sputtering method.

In this example, the material of the first buffer layer 12 is AlN; the piezoelectric material layer 15 is a zinc oxide piezoelectric film.

The manufacturing method of the above integrated device comprises the following steps:
(1) The first SiC substrate 11 was ultrasonically washed in acetone and alcohol in turn; the ultrasonically washed first SiC substrate was washed using a first mixed solution at 60° C. for 5 min; the washed first SiC substrate was rinsed with deionized water after being soaked for 1 min using a second mixed solution and then put in metal-organic chemical vapor deposition (MOCVD) reaction chamber.

The first mixed solution comprises HCl, H$_2$O$_2$ and H$_2$O in a volume ratio of 5:3:3. The second mixed solution comprises hydrofluoric acid and H$_2$O in a volume ratio of 1:10.
(2) Hydrogen was first introduced into the MOCVD reaction chamber, the first SiC substrate 11 was pre-treated at high temperature to remove adsorbate on the surface of the first SiC substrate 11; then, an AlN film grown on the surface of the first SiC substrate 11 at 950° C. to obtain a first buffer layer 12 with a thickness of 60 nm; finally, the temperature in the MOCVD reaction chamber was raised to 1040° C., and a first GaN film layer 13 with a thickness of 400 nm grown on the surface of the first buffer layer 12.

When the first GaN film layer 13 grown, a gallium source was trimethylgallium, a nitrogen source was a high-purity ammonia gas, and a carrier gas was purified hydrogen; lattice mismatch can be alleviated by arranging the first GaN film layer 13.

(3) A zinc oxide single crystal film grown on the first GaN film layer 13 by using a magnetron sputtering method to obtain a piezoelectric material layer 15 so as to obtain a piezoelectric multi-layer film with a thickness of 400 nm; then nitrogen was introduced into the MOCVD reaction chamber until the pressure in the MOCVD reaction chamber was an atmospheric pressure, and the piezoelectric multi-layer film was taken out by opening the reaction chamber.

The piezoelectric multi-layer film obtained in above steps, from top to bottom, successively comprises the first SiC substrate 11, the first buffer layer 12, the first GaN film layer 13 and the piezoelectric material layer 15 which are stacked.

Further, the process parameters for the magnetron sputtering method are as follows: a zinc target power is 100 W, an argon flow is 18 sccm, an oxygen flow is 12 sccm, the atmospheric pressure is 0.8 Pa, and a deposition thickness is 300 nm.

(4) The position that does not need etching was photo-etched using a mask after being covered, the zinc oxide piezoelectric film was etched through hydrochloric acid after photoetching was ended, until the first GaN film layer was exposed; finally, photoresist was washed away using acetone.

The photoresist was coated onto the surface of the piezoelectric material layer; the photoresist was exposed using the mask and developed; then partial regions (marked as etching regions) of the piezoelectric material layer and the functional layer that need etching were etched to expose the first GaN film layer, and the remained regions were protected by the photoresist. Specifically, the remained regions were used for manufacturing the SAW filter 10, and the etching regions were used for manufacturing the power amplifier 20, so that the SAW filter 10 and the power amplifier 20 were integrated into one device.

Figure 2:
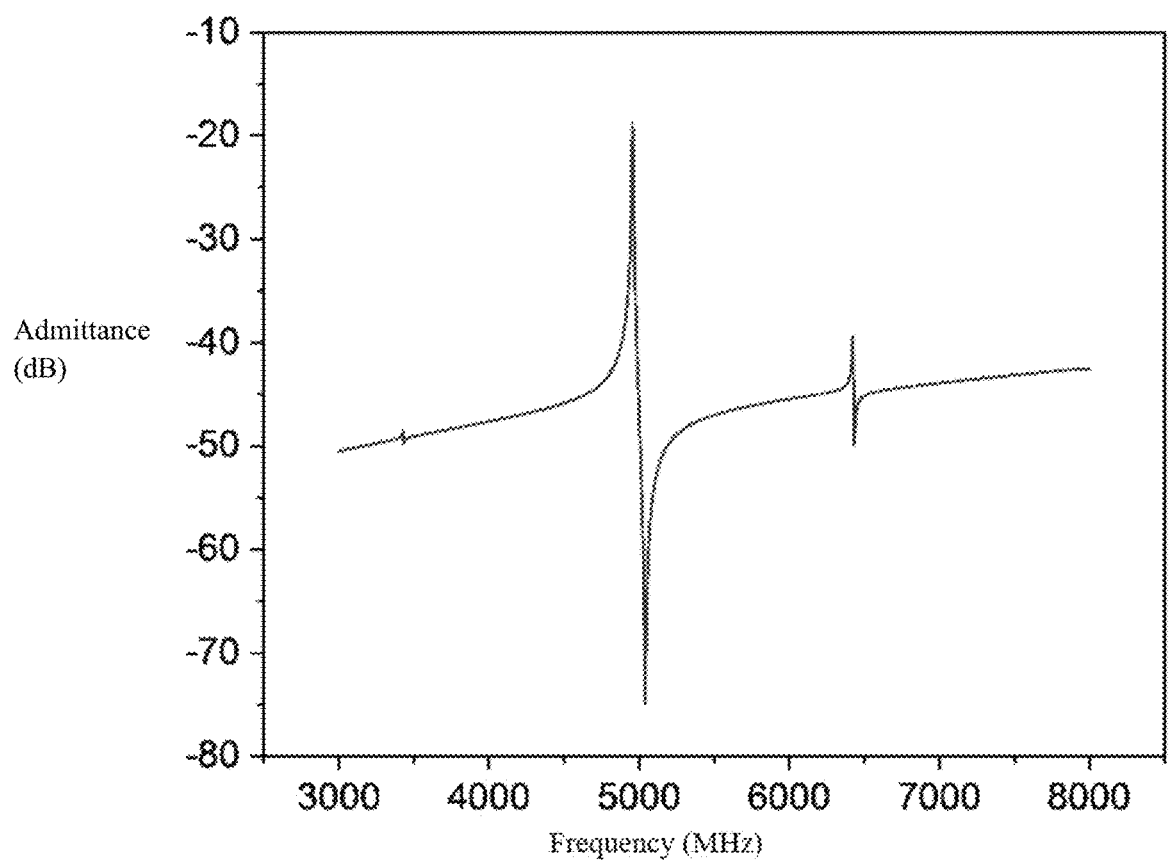
FIG. 2 shows an admittance curve of an SAW filter in example 1 of the present disclosure.

The technical solution used in this example was subjected to simulation test to obtain the admittance curve as shown in FIG. 2; during the test, the electrode material of the SAW filter was Al, and the thickness of the SAW filter was 80 nm; the frequency of the SAW filter was 4997 MHz, and the electromechanical coupling coefficient of the SAW filter was 4.15%. The growth of the zinc oxide piezoelectric film through sputtering is low in cost, so that the production cost can be greatly reduced, and the produced zinc oxide piezoelectric film can also be applied in a scene without large-bandwidth communication.

In addition, the SAW filter manufactured in the first region and the radio frequency device (power amplifier 20 in this example) manufactured in the second region were integrated into one device by using the above steps, so as to significantly reduce the size of the device and improve the performance; the integration of two radio frequency devices under the same wafer can greatly reduce the manufacturing cost of the radio frequency front-end process.

Example 2

Figure 3:
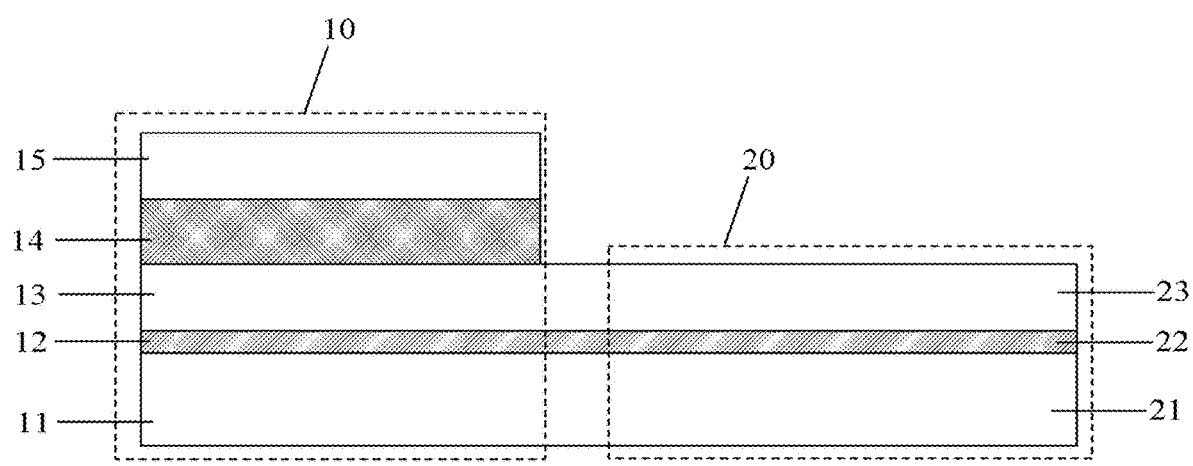
FIG. 3 is a structural diagram of an integrated device based on a third-generation semiconductor in example 2 of the present disclosure.

Referring to FIG. 3, the integrated device manufactured in this example comprises an integral device structure integrated with an SAW filter 10 and a radio frequency device 20. The SAW filter 10 manufactured in the first region comprises a first SiC substrate 11, a first buffer layer 12, a first GaN film layer 13, a functional layer 14 and a piezoelectric material layer 15 (transferred by ion implantation-annealing lift-off) which are stacked. The power amplifier 20 manufactured in the second region comprises a second SiC substrate 21, a second buffer layer 22 and a second GaN film layer 23 which are stacked.

The piezoelectric material layer 15 in this example is obtained by using an ion implantation-annealing lift-off process. Specifically, the manufacturing method of the integrated device comprises the following steps:

(1) the first SiC substrate 11 was ultrasonically washed in acetone and alcohol in turn; the ultrasonically washed first SiC substrate was washed using a first mixed solution at 60° C. for 5 min; the washed first SiC substrate was rinsed with deionized water after being soaked for 1 min using a second mixed solution and then put in a metal-organic chemical vapor deposition (MOCVD) reaction chamber.

The first mixed solution comprises HCl, $H_2O_2$ and $H_2O$ in a volume ratio of 5:3:3. The second mixed solution comprises hydrofluoric acid and $H_2O$ in a volume ratio of 1:10.

(2) Hydrogen was first introduced into the MOCVD reaction chamber, the first SiC substrate 11 was pre-treated at high temperature to remove adsorbate on the surface of the first SiC substrate 11; then, an AlN film grown on the surface of the first SiC substrate 11 at 950° C. to obtain a first buffer layer 12 with a thickness of 60 nm; finally, the temperature in the MOCVD reaction chamber was raised to 1040° C., and a first GaN film layer 13 with a thickness of 400 nm grown on the surface of the first buffer layer 12.

When the GaN film layer 13 grown, a gallium source was trimethylgallium, a nitrogen source was a high-purity ammonia gas, and a carrier gas was purified hydrogen; lattice mismatch can be alleviated by arranging the GaN film layer 13.

(3) A wafer where the GaN film layer 13 grown was put in a magnetron sputtering chamber so that $SiO_2$ grown on the surface of the GaN film layer 13 as a functional layer 14.

The thickness of the functional layer 14 was 400 nm; the functional layer 14 grown in a mode of radio frequency sputtering, with a set power of 1000 W, an argon flow of 18 mL/min, an oxygen flow of 12 mL/min, an atmospheric pressure stabilized at 0.5 Pa and a deposition of 150 nm.

(4) The ion implantation-bonding-annealing lift-off process was used in order to obtain the piezoelectric multi-layer film with a precise thickness, a four-inch X-40° Y tangential $LiNbO_3$ piezoelectric single crystal film was taken and subjected to ion implantation from its process surface, so that a damaged layer 16 was formed near the piezoelectric single crystal film with a thickness of 500 nm.

The ion types were hydrogen ions and/or helium ions, the implantation energy was 75 keV, the implantation dose was $9 \times 10^{16}$ $cm^{-2}$, and the temperature was 25° C.

(5) The process surface of the piezoelectric single crystal film subjected to implantation was bonded to a GaN/SiC wafer where $SiO_2$ grown to obtain a multi-layer structure.

The bonding process followed the following conditions: a vacuum degree was $8.0 \times 10^{-5}$ Pa, and a pressure was 800 N.

(6) Then the multi-layer structure obtained in step (5) was annealed in an annealing furnace so that the piezoelectric single crystal film was separated from the piezoelectric single crystal film along the damaged layer 16.

The used annealing temperature was 200° C., and the annealing time was 3 h.

Figure 4A:
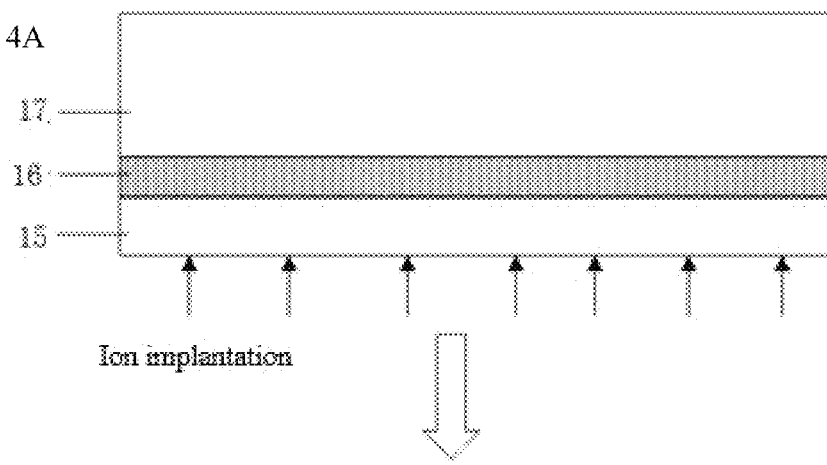
FIGS. 4A to 4C show a process flowchart of manufacturing a piezoelectric material layer in example 2 of the present disclosure.
Figure 4B:
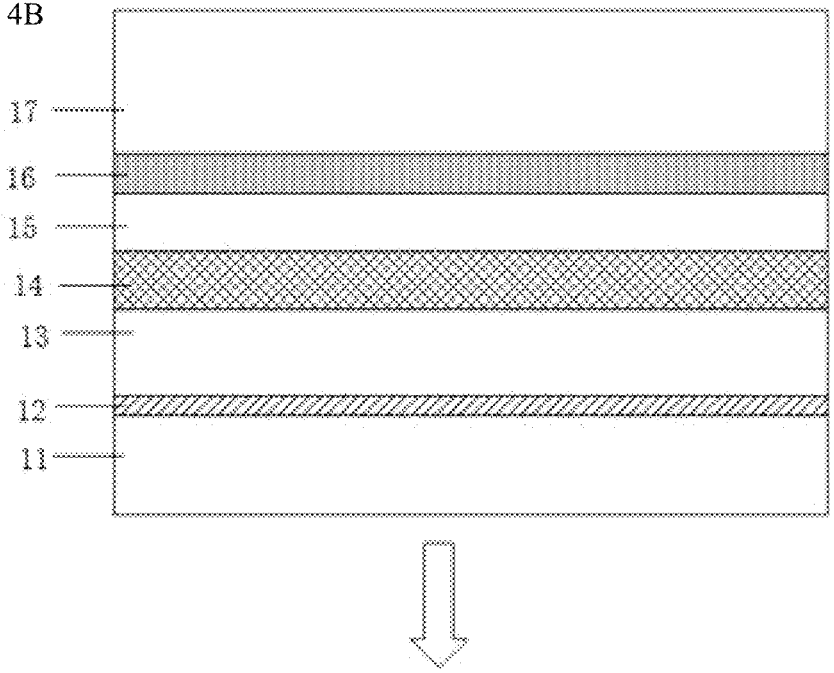
Figure 4C:
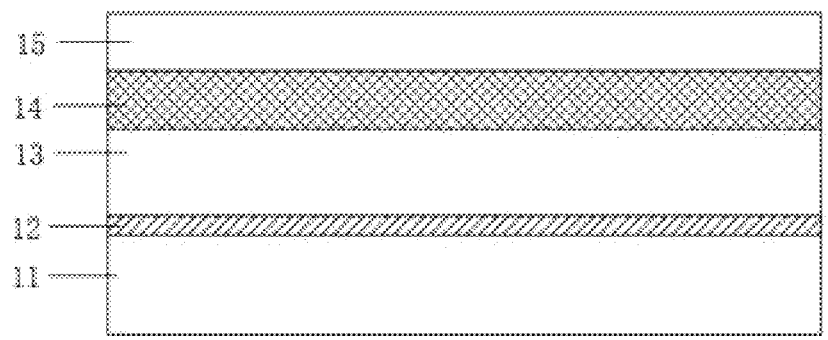

In one embodiment, referring to FIGS. 4A to 4C, FIGS. 4A to 4C show a flowchart for manufacturing the piezoelectric multi-layer film via an ion implantation-bonding-annealing lift-off process in turn in steps (4)-(6), which successively includes ion implantation (FIG. 4A)-bonding (FIG. 4B)-annealing lift-off (FIG. 4C) the piezoelectric single crystal film, so as to finally obtain the piezoelectric multi-layer film.

Specifically, FIG. 4A is a structural diagram corresponding to an ion implantation process in step (4). Ions were implanted in the process surface of the piezoelectric single crystal film to form the damaged layer 16, the piezoelectric single crystal films separating from the damaged layer 16 were marked as a peeling layer 17 and a piezoelectric material layer 15. FIG. 4B is a structural diagram corresponding to a bonding process in step (5). The piezoelectric material layer 15 was bonded on the surface of the functional layer 14 to obtain the multi-layer structure. FIG. 4C is a structural diagram corresponding to an annealing lift-off process in step (6). The multi-layer structure obtained in step (4) was peeled along the damaged layer 16 to achieve the bonding of the piezoelectric material layer 15 on the surface of the functional layer 14.

(7) The piezoelectric material layer 15 was thinned to 400 nm through chemical mechanical polishing, and the surface of the piezoelectric material layer 15 was flattened to obtain the piezoelectric multi-layer film.

So far, the obtained piezoelectric multi-layer film successively comprises a first SiC substrate 11, a first buffer layer 12, a GaN film layer 13, a functional layer 14 and a piezoelectric material layer 15 which are stacked from top to bottom.

(8) A position that did not need etching was covered with photoresist for photoetching, the piezoelectric material layer 15 and the functional layer 14 were etched through an inductively coupled plasma (ICP) process after photoetching was ended, until the GaN film layer 13 was exposed.

The etching parameters were as follows: the power was 100 W, the $SF_6$ flow was 40 sccm, and the pressure was 1 Pa.

Nitrogen was introduced into an etching machine after the etching process was completed until the pressure was an atmospheric pressure, and the etched wafer was taken out and put in acetone for glue removal.

After partial regions were etched in step (8), a second SiC substrate 21, a second buffer layer 22 and a second GaN film layer 23 represented by the second region as shown in FIG. 3 were obtained, which were used for manufacturing the power amplifier 20; and the piezoelectric multi-layer film in the first region comprised the first SiC substrate 11, the second buffer layer 12, the second GaN film layer 13, the functional layer 14 and the piezoelectric material layer 15, which were used for manufacturing the SAW filter 10.

Through the above steps, the SAW filter 10 and the power amplifier 20 were manufactured, two different devices were integrated into the integral structure, i.e., the SAW filter and the radio frequency device were integrated into one device through the above process, thereby greatly reducing the size of the device, improving the performance, achieving the integration of two radio frequency devices under the same wafer and significantly decreasing the manufacturing cost of the front-end process of the radio frequency device.

Figure 5:
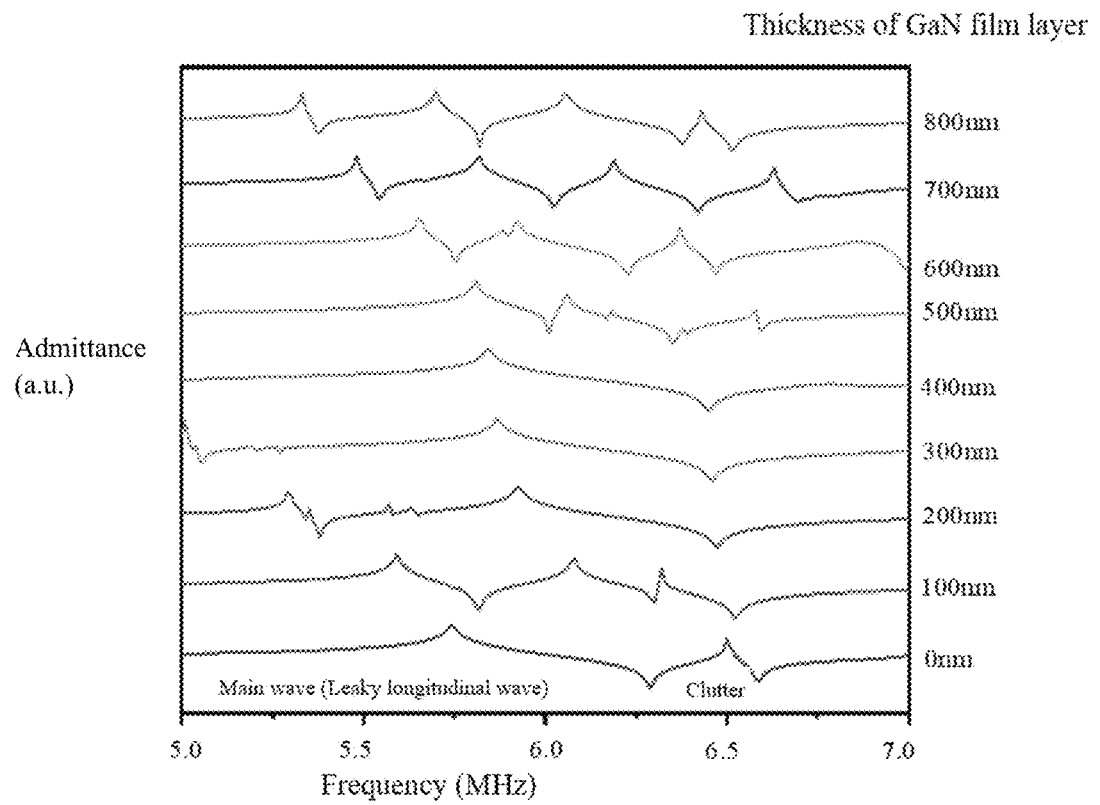
FIG. 5 shows admittance curves of SAW filters in examples 2-9 and comparative example 1 of the present disclosure.

The technical solution used in this example was subjected to simulation test to obtain the admittance curve as shown in FIG. 5; during the test, the electrode material of the SAW filter was Al, and the thickness of the SAW filter was 80 nm; by test, the frequency of the obtained SAW filter was 5.8 GHz, and the electromechanical coupling coefficient of the SAW filter was more than 20% and larger than that of the SAW filter manufactured in example 1, illustrating that in this example, when the thickness of the GaN film layer is 400 nm, a parasitic mode can be inhibited effectively so as to obtain a burr-free response. Thus, the technical solution used in this example is suitable for the requirements of 5G bandwidth low-loss filtering, and meets application requirements for frequency bands such as n77 and n78 for 5G communication and/or sub-6G frequency bands.

Example 3

Example 3 is similar to example 2 except that the thickness of the GaN film layer in step (2) is 100 nm, and others are all the same and are not described in detail here.

Example 4

Example 4 is similar to example 2 except that the thickness of the GaN film layer in step (2) is 200 nm, and others are all the same and are not described in detail here.

Example 5

Example 5 is similar to example 2 except that the thickness of the GaN film layer in step (2) is 300 nm, and others are all the same and are not described in detail here.

Example 6

Example 6 is similar to example 2 except that the thickness of the GaN film layer in step (2) is 500 nm, and others are all the same and are not described in detail here.

Example 7

Example 7 is similar to example 2 except that the thickness of the GaN film layer in step (2) is 600 nm, and others are all the same and are not described in detail here.

Example 8

Example 8 is similar to example 2 except that the thickness of the GaN film layer in step (2) is 700 nm, and others are all the same and are not described in detail here.

Example 9

Example 9 is similar to example 2 except that the thickness of the GaN film layer in step (2) is 800 nm, and others are all the same and are not described in detail here.

Comparative Example 1

Comparative example 1 is similar to example 2 except that comparative example 1 does not comprise a GaN film layer, that is, in this comparative example, a functional layer 14 directly grows on the surface of a first buffer layer 12 through sputtering, and others are the same.

Comparative Example 2

Comparative example 2 is similar to example 2 except that a GaN film layer is replaced with an AlN film layer, that is, a piezoelectric multi-layer film comprises a LiNbO$_3$ layer, a SiO$_2$ buffer layer, an AlN film layer and a SiC substrate which are stacked from top to bottom, and the thickness of the AlN film layer is 100 nm. Other manufacturing processes are the same as those in example 2, and are not described in detail here. This comparative example is similar to a LiTaO$_3$/SiO$_2$/AlN/Si structure (only the substrate material is different) reported by T. Takai in the prior art.

Comparative Example 3

Comparative example 3 is similar to example 2 except that a GaN film layer is replaced with an AlN film layer, that is, a piezoelectric multi-layer film comprises a LiNbO$_3$ layer, a SiO$_2$ buffer layer, an AlN film layer and a SiC substrate which are stacked from top to bottom, and the thickness of the AlN film layer is 200 nm. Other manufacturing processes are the same as those in example 2, and are not described in detail here.

Comparative Example 4

Comparative example 4 is similar to example 2 except that a GaN film layer is replaced with an AlN film layer, that is, a piezoelectric multi-layer film comprises a LiNbO$_3$ layer, a SiO$_2$ buffer layer, an AlN film layer and a SiC substrate which are stacked from top to bottom, and the thickness of the AlN film layer is 300 nm. Other manufacturing processes are the same as those in example 2, and are not described in detail here.

Comparative Example 5

Comparative example 5 is similar to example 2 except that a GaN film layer is replaced with an AlN film layer, that is, a piezoelectric multi-layer film comprises a LiNbO$_3$ layer, a SiO$_2$ buffer layer, an AlN film layer and a SiC substrate which are stacked from top to bottom, and the thickness of the AlN film layer is 400 nm. Other manufacturing processes are the same as those in example 2, and are not described in detail here.

Comparative Example 6

Comparative example 6 is similar to example 2 except that a GaN film layer is replaced with an AlN film layer, that is, a piezoelectric multi-layer film comprises a LiNbO$_3$ layer, a SiO$_2$ buffer layer, an AlN film layer and a SiC substrate which are stacked from top to bottom, and the thickness of the AlN film layer is 500 nm. Other manufacturing processes are the same as those in example 2, and are not described in detail here.

Comparative Example 7

Comparative example 7 is similar to example 2 except that a GaN film layer is replaced with an AlN film layer, that is, a piezoelectric multi-layer film comprises a LiNbO$_3$ layer, a buffer layer, an AlN film layer and a SiC substrate which are stacked from top to bottom, and the thickness of the AlN film layer is 600 nm. Other manufacturing processes are the same as those in example 2, and are not described in detail here.

Comparative Example 8

Comparative example 8 is similar to example 2 except that a GaN film layer is replaced with an AlN film layer, that is, a piezoelectric multi-layer film comprises a LiNbO$_3$ layer, a SiO$_2$ buffer layer, an AlN film layer and a SiC substrate which are stacked from top to bottom, and the thickness of the AlN film layer is 700 nm. Other manufacturing processes are the same as those in example 2, and are not described in detail here.

Performance Characterization:

To verify the effectiveness of the technical solution provided in the present disclosure, the technical solution in example 2 is compared with that in comparative example 1. In example 2, the thickness of the LiNbO$_3$ piezoelectric material layer is 400 nm, the thickness of the buffer layer is 60 nm, the thickness of the GaN film layer is 400 nm, the structure of the device is X-40° Y LN/SiO$_2$/GaN/AlN/SiC (piezoelectric material layer-functional layer-GaN film layer-buffer layer-SiC substrate); on this basis, the technical solutions used in examples 2-9 are subjected to simulation test to obtain an admittance curve corresponding to GaN film layers with different thicknesses. The electrode material used in test is Al, with a thickness of 80 nm. Simulation test was performed on GaN film layers with the thickness of 0 nm (comparative example 1), 100 nm (example 3), 200 nm (example 4), 300 nm (example 5), 400 nm (example 2), 500 nm (example 6), 600 nm (example 7), 700 nm (example 8) and 800 nm (example 9) to obtain an admittance curve as shown in FIG. 5.

It can be seen from FIG. 5 that when the integrated device does not comprise the GaN film layer, the functional layer directly grows on the AlN buffer layer, that is, the device structure is X-40° Y LN/SiO$_2$/AlN/SiC (piezoelectric material layer-functional layer-buffer layer-SiC substrate), the main acoustic working mode of the integrated device is a leaky longitudinal wave, with a resonant frequency of around 5.8 GHz. Furthermore, there is a significant clutter at a frequency of 6.5 GHz, which reduces the flatness of the SAW filter and leads to increase in loss.

When the thickness of the GaN film layer is between 200-400 nm, the device admittance almost has no clutter in the frequency range of 5-7 GHz; specifically, when the thickness of GaN is 400 nm, the device admittance is very clean in the frequency range of 5-7 GHz, thus achieving the most effective suppression in the parasitic mode.

Obviously, the adoption of the technical solution of the present disclosure can integrate the filter and the power amplifier into one device, and can be used without the need for backside process after integration, thereby simplifying the manufacturing process; moreover, it can be observed from examples 2-9 that the introduction of the GaN film layer can take the effects of regulating and optimizing the intrinsic properties of SAW.

Further, in the present disclosure, the AlN film layer is used to replace the GaN film layer, in such the way, the obtained device structure is X-40° Y LN/SiO$_2$/AlN/AlN/SiC (piezoelectric material layer-functional layer-buffer layer-AlN film layer-SiC substrate). When the AlN film layer is located between the AlN buffer layer and the SiC substrate, simulation test was performed on AlN film layers with the thickness of 100 nm (example 2), 200 nm (example 3), 300 nm (example 4), 400 nm (example 5), 500 nm (example 6), 600 nm (example 7) and 700 nm (example 8) to obtain an admittance curve as shown in FIG. 6.

Figure 6:
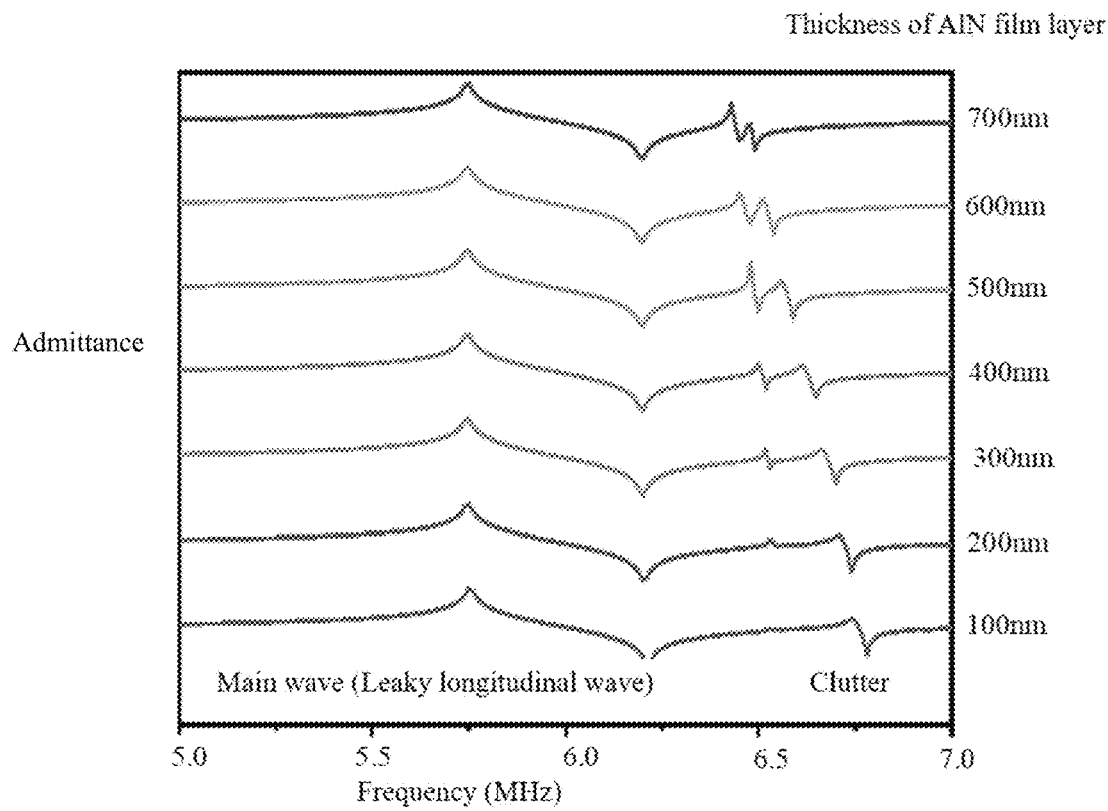
FIG. 6 shows admittance curves of SAW filters in examples 2-9 of the present disclosure.

As shown in FIG. 6, the thickness of the AlN film layer is in a range of 100-700 nm, the SAW filters cannot obtain clean admittance response, the AlN film layer cannot achieve the technical effects brought by the GaN film layer in suppressing and regulating the propagation law of sound waves and suppressing parasitic modes as in example 2.

In conclusion, in the technical solution of the present disclosure, the GaN material plays an important role in regulating the acoustic propagation rule and suppressing the parasitic mode.

The above descriptions are only preferred embodiments of the present disclosure, but are not intended to limit the protective scope of the present disclosure. For those skilled in the art, various changes and variations can be made to the present disclosure. Changes, modifications, replacements, integrations and parameter alterations made to these embodiments without departing from the principle and spirit of the present disclosure through conventional replacement or identical functions are all included within the protective scope of the present disclosure.

What is claimed is:

1. An integrated device based on a third-generation semiconductor, wherein the integrated device at least comprises:
   a SiC substrate comprising a first SiC substrate and a second SiC substrate arranged in a predetermined direction;
   a buffer layer comprising a first buffer layer stacked on the first SiC substrate and a second buffer layer stacked on the second SiC substrate;
   a GaN film layer comprising a first GaN film layer stacked on the first buffer layer and a second GaN film layer stacked on the second buffer layer; the first GaN film layer being arranged on the first buffer layer, and the second GaN film layer being arranged on the second buffer layer;
   a functional layer stacked on the first GaN film layer; and
   a piezoelectric material layer stacked on the functional layer;
   wherein the first SiC substrate, the first buffer layer, the first GaN film layer, the functional layer and the piezoelectric material layer are stacked and are configured for forming a piezoelectric multi-layer film, and the piezoelectric multi-layer film is configured for forming a surface acoustic wave (SAW) filter;
   a material of the functional layer comprises a combination of at least one of $SiO_2$, $Si_3N_4$ and $TeO_2$.

2. The integrated device based on the third-generation semiconductor according to claim 1, wherein a thickness of the GaN film layer is 50-5000 nm.

3. The integrated device based on the third-generation semiconductor according to claim 1, wherein the piezoelectric multi-layer film comprises the first SiC substrate, the first buffer layer, the first GaN film layer, the functional layer and the piezoelectric material layer, wherein the first SiC substrate, the first buffer layer, the first GaN film layer, the functional layer and the piezoelectric material layer are stacked.

4. The integrated device based on the third-generation semiconductor according to claim 3, wherein a thickness of the functional layer is 50-3000 nm.

5. The integrated device based on the third-generation semiconductor according to claim 1, wherein the second SiC substrate, the second buffer layer and the second GaN film layer are stacked and are configured for forming a radio frequency device; a thickness of the SiC substrate is 50-500 μm;
   the SiC substrate is a wafer-level substrate;
   a thickness of the buffer layer is 50-2000 nm;
   a material of the buffer layer comprises AlN;
   a material of the piezoelectric material layer comprises a combination of at least one of lithium niobate, lithium tantalate, quartz, gallium lanthanum silicate, potassium niobate, lead magnesium niobate lead titanate, bismuth germanate and zinc oxide single crystal;
   a thickness of the piezoelectric material layer is 50-3000 nm.

6. A manufacturing method of the integrated device based on the third-generation semiconductor according to claim 1, wherein the integrated device comprises an integrated device SAW filter, and the integrated device SAW filter comprises the piezoelectric multi-layer film; the manufacturing method comprises the following steps:
   providing the SiC substrate, wherein the SiC substrate comprises the first SiC substrate and the second SiC substrate arranged in a predetermined direction;
   growing the GaN film layer on the first SiC substrate and the second SiC substrate, wherein the GaN film layer at least comprises the first GaN film layer stacked on the first SiC substrate and the second GaN film layer stacked on the second SiC substrate;
   growing the functional layer on the first GaN film layer;
   growing the piezoelectric material layer on the functional layer;
   wherein the piezoelectric multi-layer film comprises the first SiC substrate, the first GaN film layer, the functional layer and the piezoelectric material layer, wherein the first SiC substrate, the first GaN film layer, the functional layer and the piezoelectric material layer are stacked.

7. The manufacturing method of the integrated device according to claim 6, comprising:
   growing the functional layer on the first GaN film layer;
   bonding a piezoelectric single crystal film with a damaged layer formed inside to the functional layer, and dissociating the piezoelectric single crystal film along the damaged layer to obtain the piezoelectric material layer arranged on the functional layer.

8. The manufacturing method of the integrated device according to claim 6, comprising:
   successively growing the buffer layer, the GaN film layer and the functional layer on the SiC substrate.

9. The manufacturing method of the integrated device according to claim 6, comprising:
   forming a damaged layer in a piezoelectric single crystal film through an ion implantation process under a first set condition, wherein ions configured for the ion implantation process comprise hydrogen ions and/or helium ions, an implantation energy is 1-2000 keV, and an implantation dose is $1\times10^{16}$-$1.5\times10^{17}$ $cm^{-2}$; the first set condition comprises a temperature of 20-150° C., a vacuum degree of less than $10^{-4}$ Pa and a pressure of 70-1000 N;
   dissociating the piezoelectric single crystal film along the damaged layer through an annealing lift-off process under a second set condition, wherein the second set condition comprises an annealing temperature of 300-700° C. and an annealing time of 0.1-5 h; and
   growing the piezoelectric material layer by using a magnetron sputtering method under a third set condition, wherein a magnetron sputtering source is a planar target magnetron sputtering source, and the third set condition comprises a power of 10-1000 W, a temperature of 20-700° C., a pressure of 0.5-1.2 Pa and a distance between a target material and a substrate of 60-80 mm.

10. The manufacturing method according to claim 8, wherein the manufacturing method further comprises:

etching partial regions of the piezoelectric material layer and the functional layer, until the second GaN film layer is exposed.

11. The manufacturing method according to claim 6, wherein in the integrated device, a thickness of the GaN film layer is 50-5000 nm.

12. The manufacturing method according to claim 6, wherein in the integrated device, the piezoelectric multi-layer film comprises the first SiC substrate, the first buffer layer, the first GaN film layer, the functional layer and the piezoelectric material layer, wherein the first SiC substrate, the first buffer layer, the first GaN film layer, the functional layer and the piezoelectric material layer are stacked.

13. The manufacturing method according to claim 12, wherein in the integrated device, a thickness of the functional layer is 50-3000 nm.

14. The manufacturing method according to claim 6, wherein in the integrated device, the second SiC substrate, the second buffer layer and the second GaN film layer are stacked and are configured for forming a radio frequency device; a thickness of the SiC substrate is 50-500 μm;
the SiC substrate is a wafer-level substrate;
a thickness of the buffer layer is 50-2000 nm;
a material of the buffer layer comprises AlN;
a material of the piezoelectric material layer comprises a combination of at least one of lithium niobate, lithium tantalate, quartz, gallium lanthanum silicate, potassium niobate, lead magnesium niobate lead titanate, bismuth germanate and zinc oxide single crystal;
a thickness of the piezoelectric material layer is 50-3000 nm.

15. The manufacturing method of the integrated device according to claim 7, comprising:
forming the damaged layer in the piezoelectric single crystal film through an ion implantation process under a first set condition, wherein ions configured for the ion implantation process comprise hydrogen ions and/or helium ions, an implantation energy is 1-2000 keV, and an implantation dose is $1\times10^{16}$-$1.5\times10^{17}$ cm$^{-2}$; the first set condition comprises a temperature of 20-150° C., a vacuum degree of less than $10^{-4}$ Pa and a pressure of 70-1000 N;
dissociating the piezoelectric single crystal film along the damaged layer through an annealing lift-off process under a second set condition, wherein the second set condition comprises an annealing temperature of 300-700° C. and an annealing time of 0.1-5 h; and
growing the piezoelectric material layer by using a magnetron sputtering method under a third set condition, wherein a magnetron sputtering source is a planar target magnetron sputtering source, and the third set condition comprises a power of 10-1000 W, a temperature of 20-700° C., a pressure of 0.5-1.2 Pa and a distance between a target material and a substrate of 60-80 mm.

16. The manufacturing method of the integrated device according to claim 8, comprising:
forming a damaged layer in a piezoelectric single crystal film through an ion implantation process under a first set condition, wherein ions configured for the ion implantation process comprise hydrogen ions and/or helium ions, an implantation energy is 1-2000 keV, and an implantation dose is $1\times10^{16}$-$1.5\times10^{17}$ cm$^{-2}$; the first set condition comprises a temperature of 20-150° C., a vacuum degree of less than $10^{-4}$ Pa and a pressure of 70-1000 N;
dissociating the piezoelectric single crystal film along the damaged layer through an annealing lift-off process under a second set condition, wherein the second set condition comprises an annealing temperature of 300-700° C. and an annealing time of 0.1-5 h; and
growing the piezoelectric material layer by using a magnetron sputtering method under a third set condition, wherein a magnetron sputtering source is a planar target magnetron sputtering source, and the third set condition comprises a power of 10-1000 W, a temperature of 20-700° C., a pressure of 0.5-1.2 Pa and a distance between a target material and a substrate of 60-80 mm.

\* \* \* \* \*